US012813229B2

(12) United States Patent
Hlod et al.

(10) Patent No.: US 12,813,229 B2
(45) Date of Patent: Nov. 24, 2026

(54) METHOD OF DETERMINING A CORRECTION STRATEGY IN A SEMICONDUCTOR MANUFACTURING PROCESS AND ASSOCIATED APPARATUSES

(71) Applicant: ASML NETHERLANDS B.V., Veldhoven (NL)

(72) Inventors: Andriy Vasyliovich Hlod, Eindhoven (NL); Arnaud Hubaux, Erpent (BE)

(73) Assignee: ASML NETHERLANDS B.V., Veldhoven (NL)

( * ) Notice: Subject to any disclaimer, the term of this patent is extended or adjusted under 35 U.S.C. 154(b) by 670 days.

(21) Appl. No.: 18/014,431

(22) PCT Filed: Jun. 21, 2021

(86) PCT No.: PCT/EP2021/066836

§ 371 (c)(1),
(2) Date: Jan. 4, 2023

(87) PCT Pub. No.: WO2022/012875

PCT Pub. Date: Jan. 20, 2022

(65) Prior Publication Data

US 2023/0260855 A1 Aug. 17, 2023

(30) Foreign Application Priority Data

Jul. 15, 2020 (EP) .................................... 20186008

(51) Int. Cl.
*H10P 74/00* (2026.01)
*G03F 7/00* (2006.01)

(52) U.S. Cl.
CPC ........ *H10P 74/238* (2026.01); *G03F 7/70525* (2013.01); *G03F 7/7065* (2013.01)

(58) Field of Classification Search
CPC ..... H01L 22/26; H01L 22/20; G03F 7/70525; G03F 7/7065; G03F 7/70491; G03F 7/70616; G03F 7/706837; Y02P 90/02
See application file for complete search history.

(56) References Cited

U.S. PATENT DOCUMENTS 6,368,883 B1 4/2002 Bode et al.
6,952,253 B2 10/2005 Lof et al.
(Continued)

FOREIGN PATENT DOCUMENTS

TW 201946101 12/2019
WO 2019185233 10/2019
(Continued)

OTHER PUBLICATIONS

International Search Report issued in corresponding PCT Patent Application No. PCT/EP2021/066836, dated Oct. 14, 2021.
(Continued)

*Primary Examiner* — Yuhui R Pan
(74) *Attorney, Agent, or Firm* — Pillsbury Winthrop Shaw Pittman, LLP

(57) ABSTRACT

A method of determining a correction strategy in a semiconductor manufacturing process. The method can include obtaining functional indicator data relating to functional indicators associated with one or more process parameters of each of a plurality of different control regimes of the semiconductor manufacturing process and/or a tool associated with the semiconductor manufacturing process and using the functional indicator data as an input to a trained model to determine for which of the control regimes should a correction be determined so as to improve performance of the semiconductor manufacturing process according to at least one quality metric being representative of a quality of
(Continued)

the semiconductor manufacturing process. The correction is then calculated for the determined control regime(s).

21 Claims, 7 Drawing Sheets

(56) References Cited

U.S. PATENT DOCUMENTS

| | | | | |
|---|---|---|---|---|
| 7,921,383 | B1 | 4/2011 | Wei | |
| 2004/0207824 | A1 | 10/2004 | Lof et al. | |
| 2010/0324878 | A1* | 12/2010 | Lee | G06F 30/39 703/14 |
| 2019/0011842 | A1* | 1/2019 | Mos | G03F 7/70633 |
| 2020/0401052 | A1 | 12/2020 | Weijden et al. | |

FOREIGN PATENT DOCUMENTS

| | | | | |
|---|---|---|---|---|
| WO | WO-2019185233 | A1 * | 10/2019 | G03F 7/70525 |
| WO | 2020156769 | | 8/2020 | |
| WO | 2021160380 | | 8/2021 | |

OTHER PUBLICATIONS

Taiwanese Office Action issued in corresponding Taiwanese Patent Application No. 110124574, dated Jul. 27, 2022.

Office Action issued in corresponding Korean Patent Application No. 10-2023-7001563, dated Jun. 16, 2026.

* cited by examiner

METHOD OF DETERMINING A CORRECTION STRATEGY IN A SEMICONDUCTOR MANUFACTURING PROCESS AND ASSOCIATED APPARATUSES

CROSS-REFERENCE TO RELATED APPLICATIONS

This application is the U.S. national phase entry of PCT patent application no. PCT/EP2021/066836 which was filed on Jun. 21, 2021, which claims priority of European patent application Serial No. 20186008.7 which was filed on Jul. 15, 2020, and which is incorporated herein in its entirety by reference.

FIELD

The present invention relates to methods of determining lithographic matching performance between lithographic apparatuses for semiconductor manufacture, a semiconductor manufacturing processes, a lithographic apparatus, a lithographic cell and associated computer program products.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm deep ultraviolet (DUV), 193 nm deep ultraviolet (DUV) and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a DUV lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET).

Alternatively, tight control loops for controlling a stability of the lithographic apparatus may be used to improve reproduction of the pattern at low $k_1$.

SUMMARY

Embodiments of the invention are disclosed in the claims and in the detailed description.

In a first aspect of the invention there is provided a method of determining a correction strategy in a semiconductor manufacturing process, the method comprising: obtaining functional indicator data relating to functional indicators associated with one or more process parameters of each of a plurality of different control regimes of the semiconductor manufacturing process and/or a tool associated with said semiconductor manufacturing process; using the functional indicator data as an input to a trained model to determine for which of said control regimes should a correction be determined so as to improve performance of said semiconductor manufacturing process according to at least one quality metric being representative of a quality of the semiconductor manufacturing process; and calculating said correction for the determined control regime(s).

BRIEF DESCRIPTION OF THE DRAWINGS

Embodiments of the invention will now be described, by way of example only, with reference to the accompanying schematic drawings, in which:

FIG. 5(*a*) is a plot of raw parameter data, more specifically reticle align (RA) data, against time t; FIG. 5(*b*) is an equivalent non-linear model function mf derived according to a method of an embodiment of the invention; and FIG. 5(*c*) comprises the residual A between the plots of FIG. 5(*a*) and FIG. 5(*b*);

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
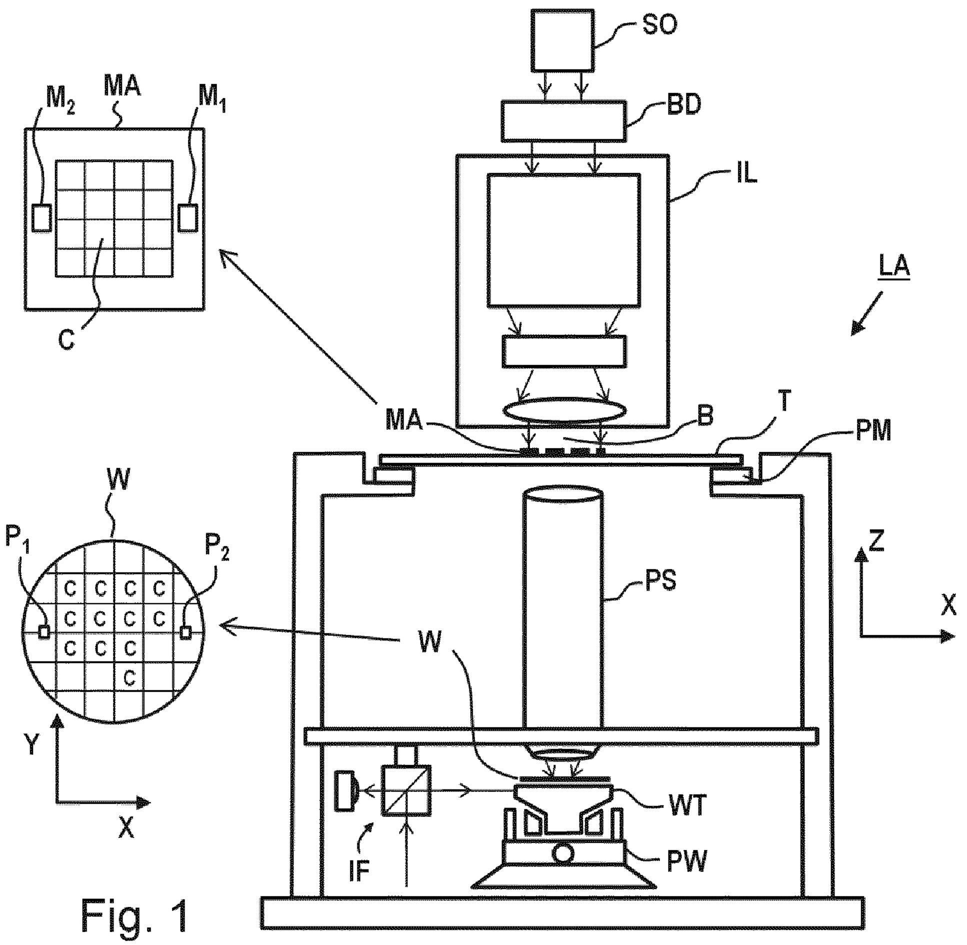
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
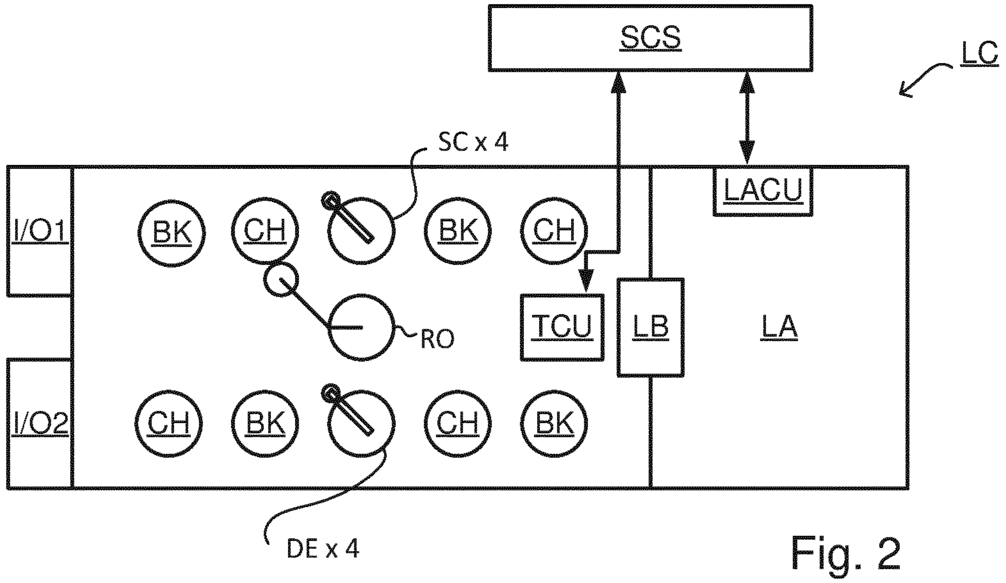
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
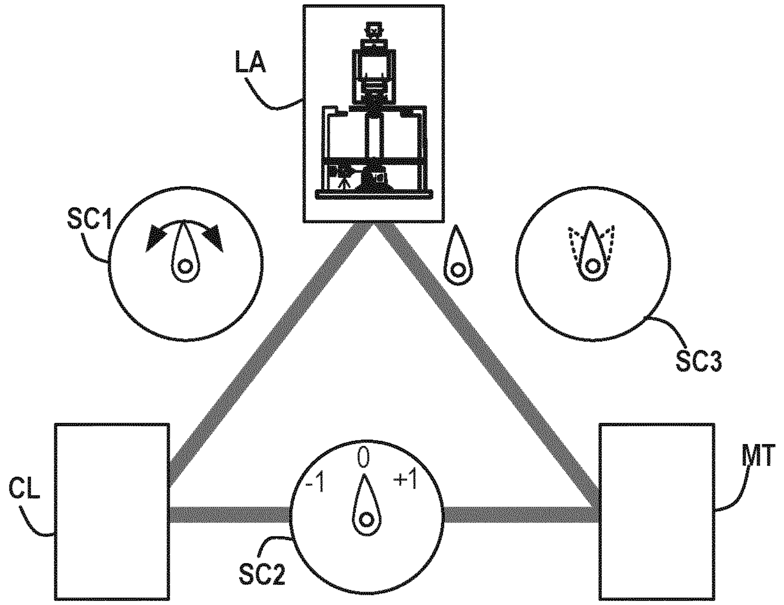
FIG. 3 depicts a schematic representation of holistic lithography, representing a cooperation between three key technologies to optimize semiconductor manufacturing.

Typically, the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As such, the proposed method comprises making a decision as part of a manufacturing process, the method comprising: obtaining scanner data relating to one or more parameters of a lithographic exposure step of the manufacturing process; deriving a categorical indicator from the scanner data, the categorical indicator being a quality metric indicative of a quality of the manufacturing process; and deciding on an action based on the categorical indicator. Scanner data relating to one or more parameters of a lithographic exposure step may comprise data produced by the scanner itself, either during or in preparation of the exposure step, and/or generated by another station (e.g., a stand-alone measuring/alignment station) in a preparatory step for the exposure. As such, it does not necessarily have to be generated by or within the scanner. The term scanner is used generally to describe any lithographic exposure apparatus.

Figure 4:
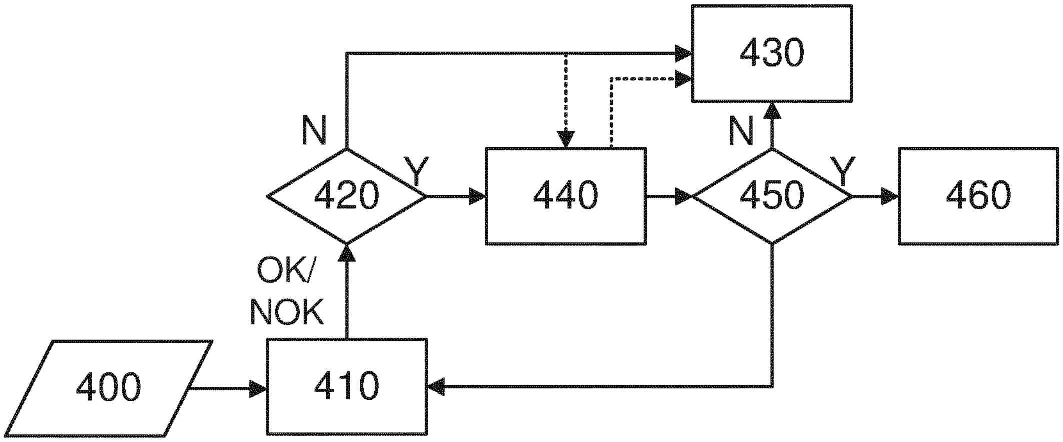
FIG. 4 is a flowchart of a decision making method.

FIG. 4 is a flowchart describing a method for making a decision in a manufacturing process utilizing a fault detection and classification (FDC) method/system. Scanner data 400 is generated during exposure (i.e., exposure scanner data), or following a maintenance action (or by any other means). This scanner data or process parameter data 400, which is numerical in nature, is fed into the FDC system 410. The FDC system 410 converts the data into functional, scanner physics-based indicators and aggregates these functional indicators according to the system physics, so as to determine a categorical system indicator for each substrate. The categorical indicator could be binary, such as whether they meet a quality threshold (OK) or not (NOK). Alternatively there may be more than two categories (e.g., based on statistical binning techniques).

A check decision 420 is made to decide whether a substrate is to be checked/inspected, based on the scanner data 400, and more specifically, on the categorical indicator assigned to that substrate. If it is decided not to check the substrate, then the substrate is forwarded for processing 430. It may be that a few of these substrates still undergo a metrology step 440 (e.g., input data for a control loop and/or to validate the decision made at step 420). If a check is decided at step 420, the substrate is measured 440, and based on the result of the measurement, a rework decision 450 is made, to decide whether the substrate is to be reworked. In another embodiment, the rework decision is made based directly on the categorical quality value determined by FDC system 410 without the check decision. Depending on the result of the rework decision, the substrate is either reworked 460, or deemed to be OK and forwarded for processing 430. If the latter, this would indicate that the categorical indicator assigned to that substrate was incorrect/inaccurate. Note that the actual decisions illustrated (check and/or rework) are only exemplary, and other decisions could be based on the categorical values/advice output from the FDC, and/or the FDC output could be used to trigger an alarm (e.g., to indicate poor scanner performance). The result of the rework decision 450 for each substrate is fed back to the FDC system 410. The FDC system can use this data to refine and validate its categorization and decision advice (the categorical indicator assigned). In particular, it can validate the assigned categorical indicator against the actual decision and, based on this, make any appropriate changes to the categorization criteria. For example, it can alter/set any categorization thresholds based on the validation. As such, all the rework decisions made by the user at step 450 should be fed back so that all check decisions of the FDC system 410 are validated. In this way, the categorical classifier within the FDC system 410 system is constantly trained during production, such that it receives more data and therefore becomes more accurate over time A scanner yields numerical scanner or exposure data, which comprises the numerous data parameter or indicators generated by the scanner during exposure. This scanner data may comprise, for example, any data generated by the scanner which may have an impact on the decision on which the FDC system will advise. For example, the scanner data may comprise measurement data from measurements routinely taken during (or in preparation for) an exposure, for example reticle and or wafer alignment data, leveling data, lens aberration data, any sensor output data etc. The scanner data may also comprise less routinely measured data (or estimated data), e.g., data from less routine maintenance steps, or extrapolated therefrom. A specific example such data may comprise source collector contamination data for EUV systems. The FDC system derives numerical functional indicators based on the scanner data. These functional indicators may be trained on production data so as to reflect actual usage of the scanner (e.g., temperature, exposure intervals etc.). The functional indicators can be trained, for example, using statistical, linear/non-linear regression, deep learning or Bayesian learning techniques. Reliable and accurate functional indicators may be constructed, for example, based on the scanner parameter data and the domain knowledge, where the domain knowledge may comprise a measure of deviation of the scanner parameters from nominal. Nominal may be based on known physics of the system/process and scanner behavior.

Models which link these indicators to on-product categorical indicators can then be defined. The categorization can be binary (e.g., OK/NOK) or a more advanced classification based on measurement binning or patterns. The link models tie the physics driven functional indicators to observed on-product impact for specific user applications and way of working. The categorical indicators aggregate the functional indicators according to the physics of the system. There may be two or more levels or hierarchies of categorical indicators, each for a particular error contributor. For example, a first level may comprise overlay contributors (e.g., a reticle align contributor to X direction intra-field overlay, a reticle align contributor to Y direction inter-field overlay, a leveling contributor to inter-field CD, etc. A second level of categorical indicators may aggregate the first level categorical indicators (e.g., in terms of direction and/or in terms of inter-field versus intra-field for overlay and/or in terms of inter-field versus intra-field for CD. These may be aggregated further in a third level: e.g., overlay OK/NOK and/or a CD OK/NOK. The categorical indicators mentioned above are purely for example, and any suitable alternative indicators may be used. These indicators can then be used to provide advice and/or make process decisions, such as whether to inspect and/or rework a substrate.

The categorical indicators may be derived from models/simulators based on machine learning techniques. Such a machine learning model can be trained with historical data (prior indicator data) labeled according to its appropriate category (i.e., should it be reworked). The labeling can be based on expert data (e.g., from user input) and/or (e.g., based on) measurement results, such that the model is taught to provide effective and reliable prediction of substrate quality based on future numerical data inputs from scanner data. The system categorical indicator training may use, for example, feedforward neural network, random forest, and/or deep learning techniques. Note that the FDC system does not need to know about any user sensitive data for this training; only a higher-level categorization, tolerance and/or decision (e.g., whether or not a substrate would be reworked) is required.

Figure 5:
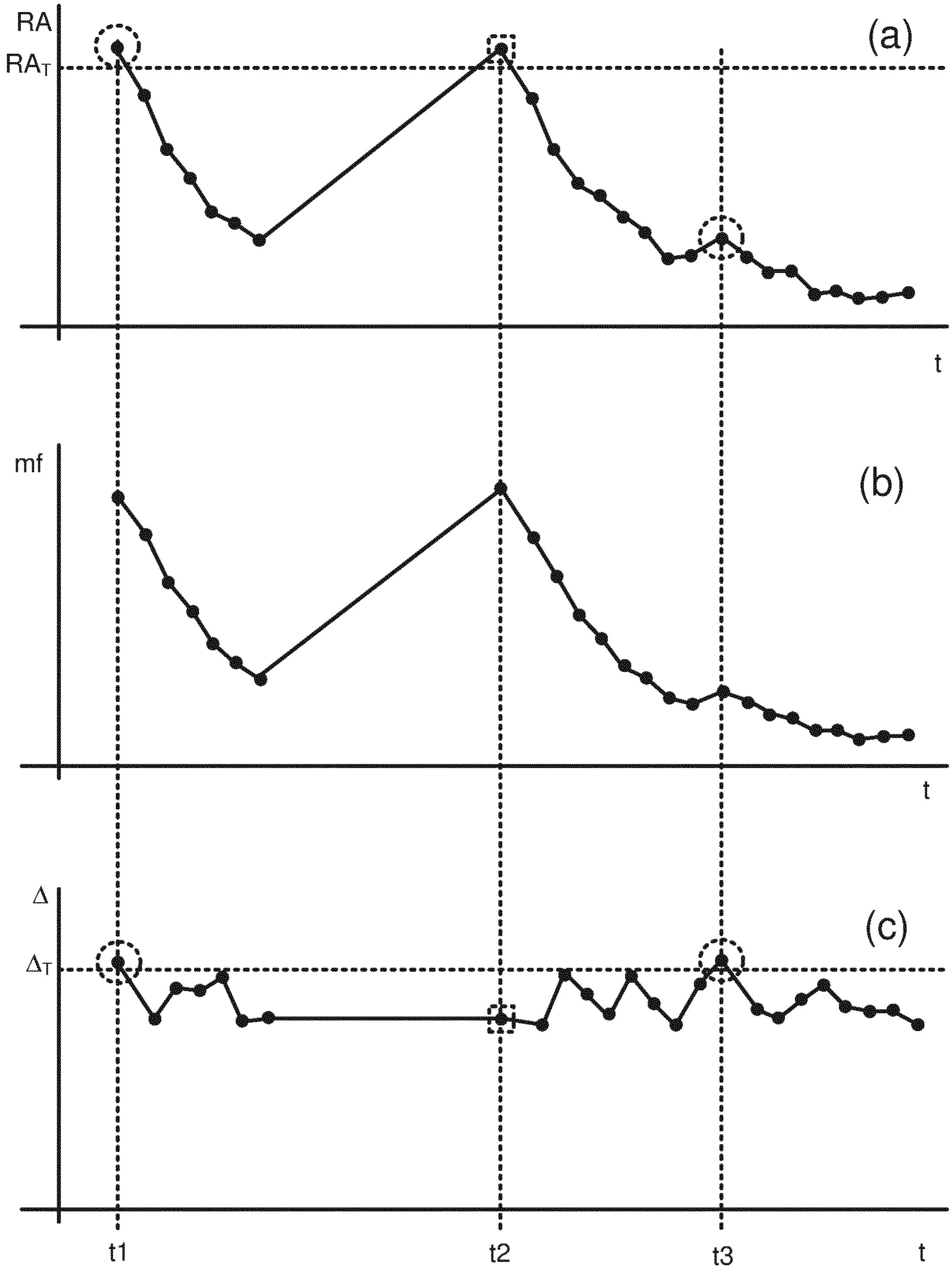
FIG. 5 comprises three plots relating to a common timeframe.

FIG. 5 comprise three plots which illustrate the deriving of the functional (and categorical) indicators, and their effectiveness over the statistical indicators used presently. FIG. 5(*a*) is a plot of raw parameter data, more specifically reticle align (RA) against time t. The raw parameter data may relate to any process parameter, e.g., any parameter of the scanner and/or lithographic process. FIG. 5(*b*) is an equivalent (e.g., for reticle align) non-linear model function (or fit) mf derived according to methods described herein. As described, such a model can be derived from knowledge of the scanner physics, and can further be trained on production data (e.g., in this specific case, reticle align measurements performed when performing a specific manufacturing process of interest). The training of this model may use statistical, regression, Bayesian learning or deep learning techniques, for example. FIG. 5(*c*) comprises the residual A between the plots of FIG. 5(*a*) and FIG. 5(*b*) which can be used as the functional indicator of the methods disclosed herein. One or more thresholds AT can be set and/or learned (e.g., initially based on user knowledge/expert opinion and/or training as described), thereby providing a categorical indicator. In particular, the threshold(s) AT is/are learned by categorical classifier block 430 (FIG. 4) during the training phase which trains the categorical classifier. It may be that these threshold values are actually unknown or hidden (e.g., when implemented by a neural network). Categorical indicators may relate to one or more of overlay, focus, critical dimension, critical dimension uniformity, for example (e.g., OK/NOK based on which side of the threshold a value is, although non-binary categorical indicators are also possible and envisaged).

It is instructive to compare this to the statistical control technique which is typically employed on the raw data at present. Setting a statistical threshold RAT to the raw data of FIG. 5(*a*) will result in the outlier at time t1 being identified, but not that at time t3. Furthermore, it will incorrectly identify the point at time t2 as an outlier, when in fact it is not (i.e., it is OK) according to the categorical indicator disclosed herein (illustrated in FIG. 5(*c*)).

The functional indicators may be defined along the life of the wafer within the scanner and/or other tool (e.g., from loading, measurement (alignment/leveling etc.), exposure etc. As such, raw data relating to a plurality of scanner and process parameters can be treated in the same manner as that illustrated in FIG. 5 to obtain functional indicators for each one, where the functional indicators comprise a residual (e.g., over time) with respect to an expected, nominal or average behavior. These functional indicators can be combined and/or aggregated per tool (and/or per process) to obtain a scanner functional fingerprint comprising a model which functionality defines the on-product performance of the scanner.

Figure 6:
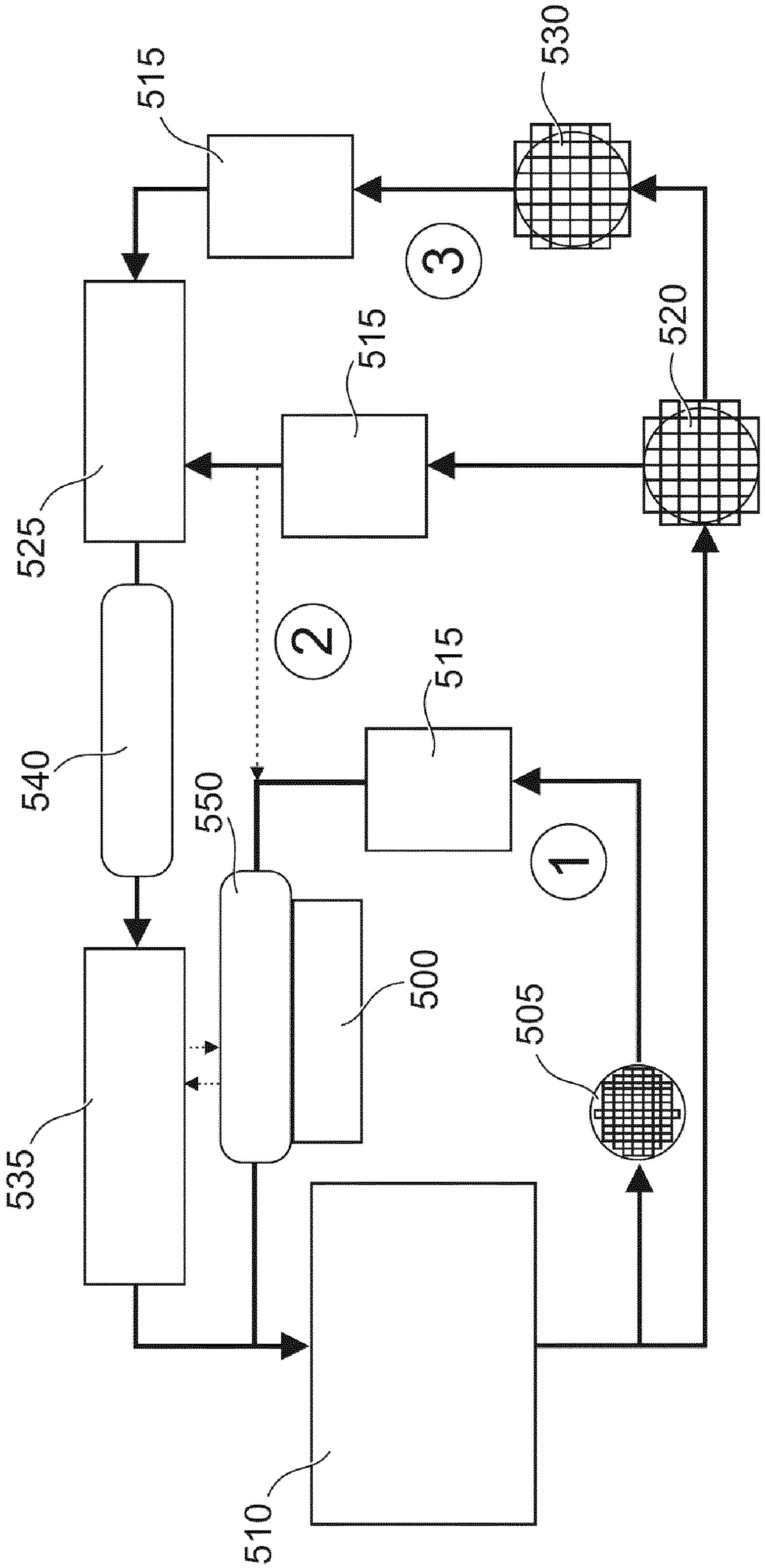
FIG. 6 is a schematic overview of control mechanisms in a lithographic process utilizing a scanner stability module.

FIG. 6 depicts the overall lithography and metrology method incorporating a stability module 500 (essentially an application running on a server, in this example). Shown are three main process control loops, labeled 1, 2, 3. The first loop provides recurrent monitoring for stability control of the lithography apparatus using the stability module 500 and monitor wafers. A monitor wafer (MW) 505 is shown being passed from a lithography cell 510, having been exposed to set the baseline parameters for focus and overlay. At a later time, metrology tool (MT) 515 reads these baseline parameters, which are then interpreted by the stability module (SM) 500 so as to calculate correction routines so as to provide scanner feedback 550, which is passed to the main lithography apparatus 510, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in the metrology tool.

The second (APC) loop is for local scanner control on-product (determining focus, dose, and overlay on product wafers). The exposed product wafer 520 is passed to metrology unit 515 where information relating for example to parameters such as critical dimension, sidewall angles and overlay is determined and passed onto the Advanced Process Control (APC) module 525. This data is also passed to the stability module 500. Process corrections 540 are made before the Manufacturing Execution System (MES) 535 takes over, providing control of the main lithography apparatus 510, in communication with the scanner stability module 500.

The third control loop is to allow metrology integration into the second (APC) loop (e.g., for double patterning). The post etched wafer 530 is passed to metrology unit 515 which again measures parameters such as critical dimensions, sidewall angles and overlay, read from the wafer. These parameters are passed to the Advanced Process Control (APC) module 525. The loop continues the same as with the second loop.

The different control loops may be grouped into internal control loops and external control loops. Internal control loops use direct sensor measurements at given moments in time to measure and optimize the Scanner behavior. When optimizations are applied, the difference between the output of a scanner model (e.g., a model of at least one aspect of scanner behavior which provides estimates of a scanner process) and reality reduces non-corrected errors (residuals) to virtually zero. In-between the measurements and optimizations, residuals vary (increase), which can lead to on-product impact (e.g. overlay). External loops mostly use on-product measurements to calculate scanner corrections (e.g. the stability monitoring and APC loops described by FIG. 6) which are regularly updated on the scanner (e.g., recipe updates).

Internal loops enable very fast corrections but suffer from a short time horizon. They also are unable to make significant learning from systematic variation fingerprints, long-term drifts and on-product impact. External loops enable learning from systematic variation fingerprints, long-term drifts and on-product impact but suffer from time-consuming and limited checks (e.g. dedicated wafer measurements). The corrections are therefore slow and coarse.

It is proposed to combine the fast corrections enabled by scanner inline control with the learning from systematic variation fingerprints, long-term drifts and on-product impact. The methods proposed herein thereby combine the advantages of both internal and external control loops while reducing their disadvantages.

The proposed method may be based on an application comprising a detection model which provides physics models of residuals and uses them to predict on-product categorical indicators (e.g., OK/NOK). Such models combine inline scanner residuals for every wafer with a prediction of on-product impact. Examples of such a model are described above, in relation to FIGS. 4 and 6, for example.

The scanner data and physics residuals can be used to calculate correctable errors immediately after exposure of a wafer (e.g., for each wafer). In addition to data from the immediately preceding wafer exposure, this calculation can use data from one or more earlier wafer exposures. It thereby can calculate a correction model that can fit variation fingerprints, long-term drifts and on-product impact.

A machine learning model may be trained which learns, from the correctable physics, which scanner corrections may have the most impact. An example of such model may comprise a neural network using a softmax function as an output function to normalize candidate or possible correction sets into a probability distribution. Determining the most impact may mean reducing scanner residuals such that predicted product impact goes from NOK to OK, thereby improving scanner performance and stability, and/or determining which correction set reduces the residuals to the smallest values (assuming that the wafer is OK).

Multiple machine learning techniques may be used to label the actions and enable the supervised learning. One approach may comprise mapping actions to a pre-defined equipment status. Then, a loss function (e.g., based on multi-class cross-entropy) may be used to calculate the delta and back-propagate the learning into the model.

Another approach may comprise applying reinforcement learning directly to the actions and training the model to learn the mapping between actions and equipment status improvements. Rewards (and critics) can be calculated based on the distance between an optimum equipment status (e.g., zero residual) and the measured equipment status.

Since the number of actions can be large, they may be gathered into action sets based on input patterns. These sets may then result in different model instances, each trained separately. In such an embodiment, the prediction requires a pre-processing step to select the correct model for making the prediction.

To ensure model convergence and accuracy when deployed, the model should be pre-trained in a calibration, rather than being trained during actual use of the model in semiconductor production. The pre-training is recommended as the accuracy of an insufficiently trained model may be so low as to actually degrade scanner performance. As such, a proper label generator (e.g., a model such as model 710 in FIG. 7 described below) may be provided based on known scanner physics and experimental data conveying the relation between the scanner physics and scanner performance, so as to provide training data for the correction model.

In addition to the correction model, the correction system may further comprise a constraint solver (e.g., a SAT, SMT or other CSP). This constraint solver checks that any proposed correction set from the correction model does not violate any design constraint or rules; to ensure that the corrections are physically actuatable and will not result in damage; e.g., that the system can safely execute the actions.

In this way, the proposed correction system combines deductive reasoning (constraint solver and physics) and inductive reasoning (machine learning) into a single artificial intelligence solution.

Figure 7:
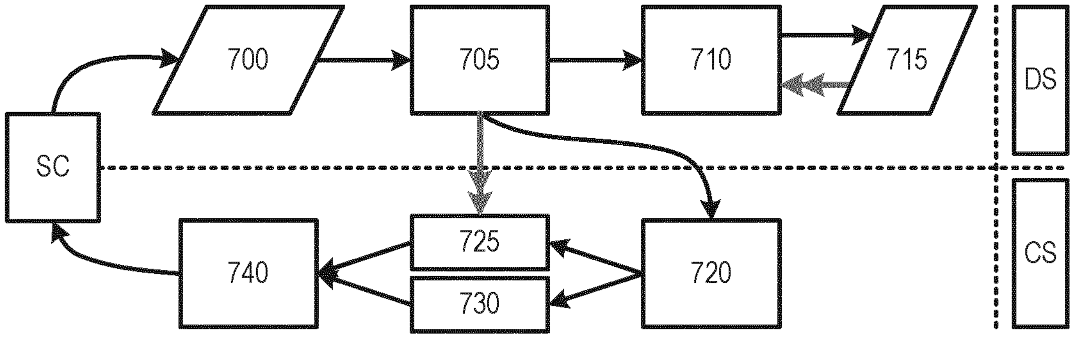
FIG. 7 is a flowchart of a method for predicting correction actions according to an embodiment of the present invention.

FIG. 7 comprises a flow diagram describing such an embodiment. The black arrows describe the prediction flow and the double-headed gray arrows describe the training flow. The flow in the top half (above the dashed line) of the Figure relate to the detection system DS and largely comprises operation of the FDC system already described to make categorical predictions. The flow in the bottom half describes a correction system CS according to an embodiment.

Scanner data 700, which may comprise values for any parameter measured or recorded by the scanner SC (and/or any scanner parameter measured using another device), is used to calculate physics residuals 705, e.g., a difference between a measured parameter and modeled parameter, the latter modeled by a physics-based or functional model. The residuals may be calculated separately for each of a number of parameters relating to different aspects of scanner control or control regimes; e.g., fine wafer alignment, horizontal stage alignment, vertical stage alignment, reticle heating parameters, lens control parameters, lens actuation parameters etc. As such, control regime may relate to any aspect of process control, any particular sensor and/or any module of the scanner or other apparatus used in semiconductor manufacture. These residuals are fed into a trained machine learning model 710 which makes categorical predictions 715 based on the residuals, and labels wafers accordingly. For training the model, some of these labeled wafers will undergo a further metrology step to assess the accuracy of the prediction. The result of this measurement with respect to the assigned label can then be used to train the model. This training may be continuous to maintain accuracy against process drifts, scanner drifts etc.

The correction system CS comprises a step of calculating corrections 720 for the residuals calculated at step 705. These corrections may be calculated individually for each regime; e.g., a fine wafer alignment correction may be calculated to correct the fine wafer alignment residuals, a lens heating correction calculated to correct the lens heating residuals etc. It should be appreciated that these corrections cannot simply all be applied with the expectation of an improved result. The interactions of each control regime are complex and unpredictable using a physics-based approach alone. An improvement in one control regime may impact another control regime to a degree that the overall result is worse. Also not all corrections or combinations of corrections are actuatable or allowable and/or meet design rules or constraints for the process. Therefore, the corrections are fed into the trained correction model 725 to select a preferred correction set/strategy and (e.g., in parallel) into a constraint solving model or step 730 which uses expert rules to assess whether design rules are met and the correction set/strategy is allowable. The trained correction model 725 may output a probability distribution assessing the probability that a particular correction or correction set (e.g., combination of corrections) will have positive impact on the process (e.g., improve the wafer status from NOK to OK). Finally, the selected correction set is actioned 740 by scanner SC.

The trained correction model 725 will try to predict the residual reduction of the physics. Therefore, the residual reduction may be fed back (double-headed arrow) to the correction model 725 which will enable the model to learn and select the corrections sets which deliver the best possible residual reduction.

Figure 8:
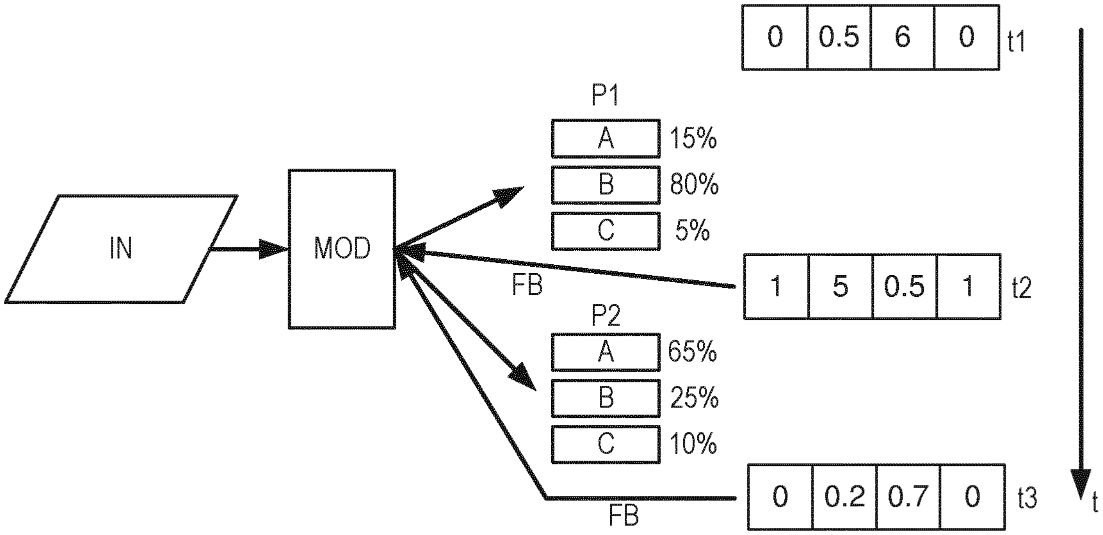
FIG. 8 is a flowchart of a method for training a model according to an embodiment of the present invention.

FIG. 8 is a flowchart illustrating conceptually the training of the correction model 725. Input data IN may comprise feature values from the equipment raw data (e.g., scalar). Features are not necessarily only status indicators, and may include any sensor information. This input data IN is fed into correction model MOD, which provides a first prediction output P1 based on this input data. For example, this prediction may comprise a probability distribution of predicted greatest impact of a number of possible actions or corrections sets. The example here shows three actions A B C with an associated predicted probability. The impact of the correction is shown on the right, where the boxes show equipment status values, e.g., which should all ideally be zero, at times t1, t2 and t3. At time t1, the status is the initial status before training. At time t2, it can be seen that applying prediction P1 has made the status worse. The residual between this status and the previous status is calculated and back-propagated to the model MOD for learning. A second prediction P2 is made from the input data P2. It can be seen that the status at t3 is positively impacted by this predicted correction strategy, and again the residual between the status values at times t3 and t2 is back-propagated for learning. In this manner, the model will learn to predict correction sets which improve performance from scanner input data. Of course, this is a highly simplified conceptual description of the training steps.

A second embodiment will now be described which determines a correction for an inline reference. Drifts of inline references in the scanner, such as fiducials and wavefront sensor references (e.g., at each of the measure and expose sides where the scanner is a two stage scanner) result in a scanner performance error. Dedicated measurements and calibration in the scanner can attempt to remedy these errors in part, using redundancy or degrees of freedom in the system. However, redundant measurements are not always possible and not all references can be corrected like this; therefore some references cannot be updated using present methods. Furthermore dedicated measurement and calibration takes time.

External control loops can use advanced modeling and dedicated wafers to identify and fix the root cause, (e.g., using the stability module loop as described in FIG. 6); or simply correcting errors via scanner actuation interfaces using APC loops (also described in FIG. 6). In some cases only APC loops are available, as the stability monitoring loop is not implemented, e.g., due to the latter's inherent throughput penalty. If the root cause of the error is a drifting reference, then correcting for it via APC does not address the error root cause and its impact is only partly fixed. Because of the unaddressed root cause, the efficiency of inline control deteriorates resulting in unnecessary compensatory actions, e.g., unnecessary lens moves etc. Therefore APC loops do not correct these errors in the correct place within the scanner.

As has been described, functional models use generated scanner data to determine (e.g., inline) process parameter values (e.g., as measured within the scanner) and errors/residuals from each relevant scanner module or control regime. For example, these process parameters may be extracted from a quality metric map (e.g., a product overlay or focus map of residuals). It is proposed in this embodiment to use one or more functional indicators as an input for a trained model to predict drift of performance (e.g., focus/overlay/other quality metric or process parameter indicative of a quality of the manufacturing process) and subsequently optimize one or more scanner reference settings associated with the one or more functional indicators as having a significant predicted impact on the performance drift.

A prediction model or machine learning model is trained per process parameter or functional indicator, where an online functional indicator may be a number which represents (or via relatively simple mathematical expression is related to) an error made by a particular module or control regime of the lithographic process. Here, the prediction model may be a regression like model, neural network/other AI model or any other suitable model. The prediction model may receive inline functional indicators (and possibly other relevant indicators) from all relevant modules/control regimes as an input, and output a predicted quality metric (e.g., an overlay, focus or other product parameter indicative of quality). The number of input functional indicators should be as complete as possible. As such, the trained prediction model may be used to predict the impact of the individual functional indicators on one or more quality metrics. The model may have been trained using historical data from the same scanner labeled with measurements of the quality metric.

More specifically, in addition to the prediction itself, an explanation of the prediction can be determined. For example, for a regression-type models, such an explanation can be determined simply from the regression coefficients (e.g., their magnitude). For other models, such as neural networks, Local Gradient Explanation Vector methods or similar may be used to obtain this explanation. In this manner the prediction model also identifies the modules or control regimes which have made the greatest contribution to errors or drifts in the quality metric. If one or more functional indicators are flagged as making a statistically significant contribution to the error, an update of an inline reference associated with the corresponding functional indicator is instigated.

If it is established that any error or drift is explained by a process parameter or inline parameter which is dependent on a reference such as described, the corresponding reference (s) may be corrected, e.g., using the values for the drifted process parameter as determined from the estimated quality metric and relevant functional indicator(s).

As such, the proposed method comprises obtaining inline data associated with a status of a tool, using a functional model to determine at least one functional indicator associated with a control regime of the tool based on the inline data, using a trained model to associate the at least one functional indicator with an expected quality of one or more patterned substrates; determining the significance of the at least one functional indicator in explaining the expected quality in case the expected quality fails to meet a requirement; and configuring the tool based on the determined significance.

Figure 9:
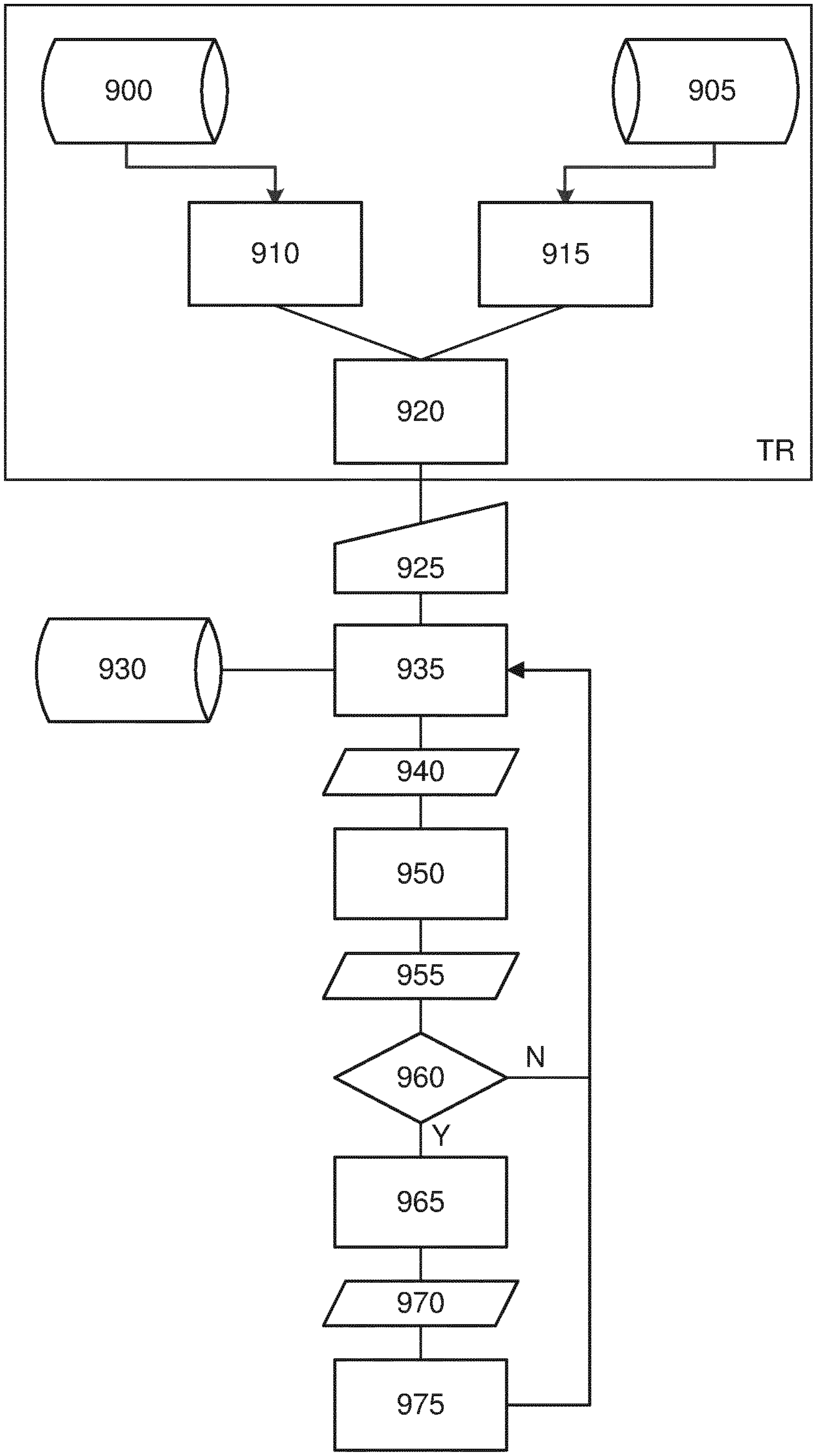
FIG. 9 is a flowchart of a method for correcting inline references according to an embodiment of the present invention.

FIG. 9 is a flow diagram describing such an embodiment. In a training phase TR, historic lot data 900 is used to determine 910 functional indicators relating to all inline actions relevant to at least one process parameter. Also, historic quality metric data 905 (e.g., from measurements of the quality metric) is used to calculate 915 values of the same process parameter(s) from the measurement data. By way of specific example, step 915 may comprise extracting the process parameter values from an on-product overlay and/or focus map. At step 920, a machine learning model is trained to map, per process parameter, the functional indicators to the quality metric values derived from the measurement data so as to obtain trained model 925.

After training, e.g., in a production setting, scanner data 930, e.g., relating to wafers which have just been exposed is used to compute 935 predictions, e.g., of expected values for the quality metric. The resultant predictions 940 are then used in a step 950 of explaining the predictions, e.g., so as to identify which functional indicators contribute most to a prediction, and more specifically to any prediction indicative of failure or of low or marginal quality. The output of this step 950 may comprise weights 955 of the functional KPIs to the prediction. At step 960, it may be determined whether any statistically significant drift has occurred per functional indicator for each process parameter. If so, at step 965, a corresponding reference for the drifting process parameter is identified and a correction 970 is determined for the reference. The correction 970 may be determined from or as a reference delta or difference calculated from the drifting functional indicators and/or corresponding estimated quality metric. For example, the correction may be determined from the functional indicator value weighted by the respective weighting 955. Alternatively, it may be determined from a minimization of the difference of a target quality metric value and the modeled quality metric value in terms of said process parameter. Finally at step 975, the reference(s) is/are updated and the process continues.

In all embodiments above, the trained model may be trained using simulated data as well as measured historic data.

Figure 10:
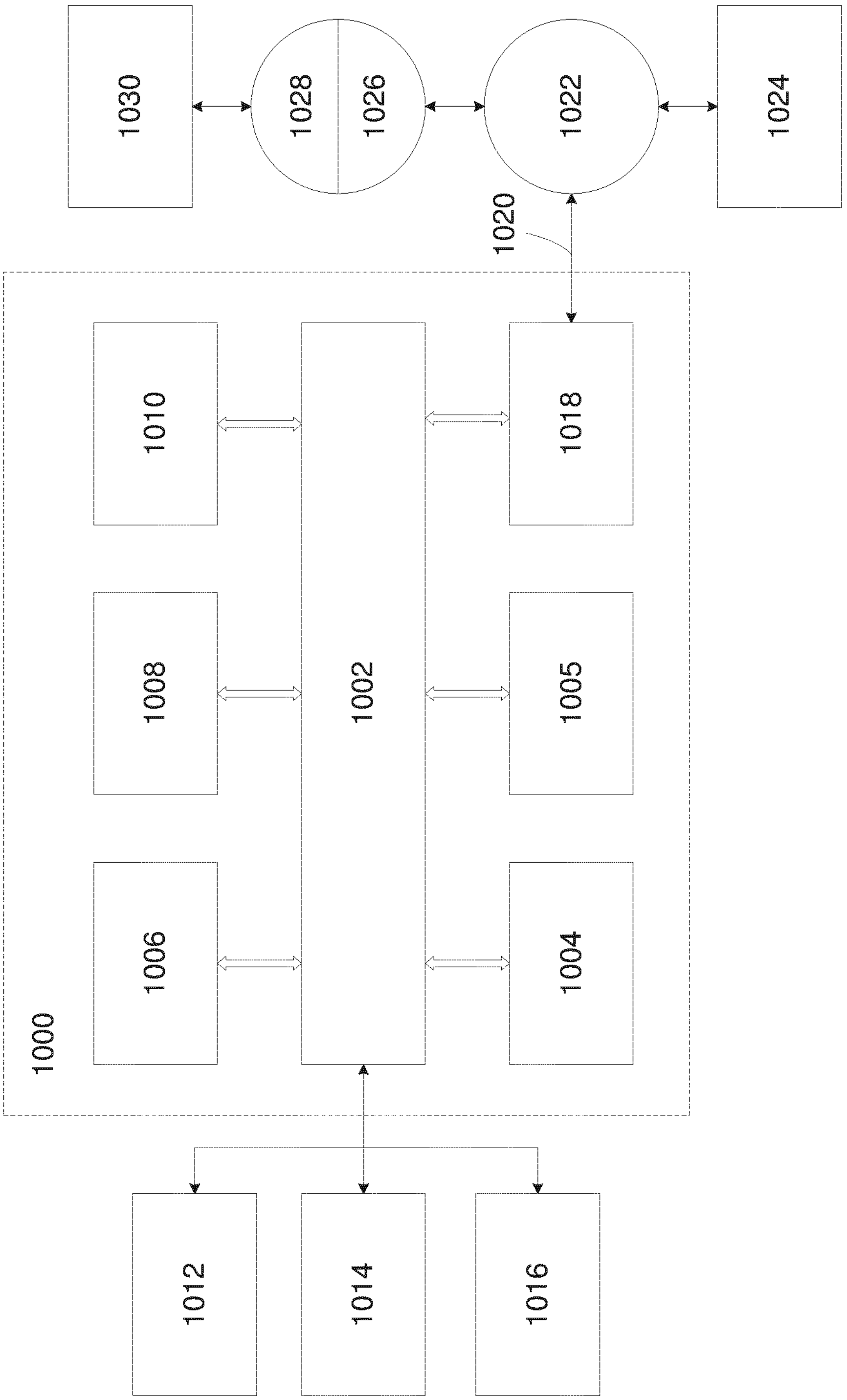
FIG. 10 depicts a block diagram of a computer system for controlling a system and/or method as disclosed herein.

FIG. 10 is a block diagram that illustrates a computer system 1000 that may assist in implementing the methods and flows disclosed herein. Computer system 1000 includes a bus 1002 or other communication mechanism for communicating information, and a processor 1004 (or multiple processors 1004 and 1005) coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT) or flat panel or touch panel display for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1000 in response to processor 1004 executing one or more sequences of one or more instructions contained in main memory 1006. Such instructions may be read into main memory 1006 from another computer-readable medium, such as storage device 1010. Execution of the sequences of instructions contained in main memory 1006 causes processor 1004 to perform the process steps described herein. One or more processors in a multi-processing arrangement may also be employed to execute the sequences of instructions contained in main memory 1006. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1004 for execution. Such a medium may take many forms, including but not limited to, non-volatile media, volatile media, and transmission media. Non-volatile media include, for example, optical or magnetic disks, such as storage device 1010. Volatile media include dynamic memory, such as main memory 1006. Transmission media include coaxial cables, copper wire and fiber optics, including the wires that comprise bus 1002. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1004 for execution. For example, the instructions may initially be borne on a magnetic disk of a remote computer. The remote computer can load the instructions into its dynamic memory and send the instructions over a telephone line using a modem. A modem local to computer system 1000 can receive the data on the telephone line and use an infrared transmitter to convert the data to an infrared signal. An infrared detector coupled to bus 1002 can receive the data carried in the infrared signal and place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also preferably includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the worldwide packet data communication network, now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 may send messages and receive data, including program code, through the network(s), network link 1020, and communication interface 1018. In the Internet example, a server 1030 might transmit a requested code for an application program through Internet 1028, ISP 1026, local network 1022 and communication interface 1018. One such downloaded application may provide for one or more of the techniques described herein, for example. The received code may be executed by processor 1004 as it is received, and/or stored in storage device 1010, or other non-volatile storage for later execution. In this manner, computer system 1000 may obtain application code in the form of a carrier wave.

Embodiments may be implemented in a lithographic apparatus, such as described with reference to FIG. 1, comprising:

an illumination system configured to provide a projection beam of radiation;

a support structure configured to support a patterning device, the patterning device configured to pattern the projection beam according to a desired pattern;

a substrate table configured to hold a substrate;

a projection system configured the project the patterned beam onto a target portion of the substrate; and a processing unit configured to perform any of the methods described herein.

Embodiments may be implemented in any of the tools represented in a lithocell, such as described with reference to FIG. 2.

Embodiments may be implemented in a computer program product comprising machine readable instructions for causing a general-purpose data processing apparatus to perform the steps of a method as described.

Further embodiments are disclosed in the list of numbered clauses below:

1. A method of determining a correction strategy in a semiconductor manufacturing process, the method comprising:
   obtaining functional indicator data relating to functional indicators associated with one or more process parameters of each of a plurality of different control regimes of the semiconductor manufacturing process and/or a tool associated with said semiconductor manufacturing process;
   using the functional indicator data as an input to a trained model to determine for which of said control regimes should a correction be determined so as to improve performance of said semiconductor manufacturing process according to at least one quality metric being representative of a quality of the semiconductor manufacturing process; and
   calculating said correction for the determined control regime(s).
2. A method according to clause 1, comprising using a functional model to determine said functional indicator data based on process parameter data related to said process parameters.
3. A method according to clause 2, wherein said process parameter data comprises data relating to earlier exposures of more than one preceding substrates.
4. A method according to any preceding clause, comprising determining candidate correction strategies based on said functional indicators, wherein each candidate correction strategy relates to a different control regime or combination thereof; and using said trained model to select a preferred correction strategy from the candidate correction strategies.
5. A method according to clause 4, wherein the preferred correction strategy is one determined by said trained model to have the highest probability of improving the quality metric.
6. A method according to clause 4 or 5, wherein said trained model is operable to rank said candidate correction strategies in terms of their respective probabilities of improving the quality metric.
7. A method according to clause 6, wherein said trained model comprises an output function operable to rank said candidate correction strategies into a probability distribution.
8. A method according to any of clauses 4 to 7, comprising grouping said candidate correction strategies into sets based on patterns in said functional indicator data, each set relating to a different trained model having been separately trained; and performing a pre-processing step to select a model for making the prediction.
9. A method according to any of clauses 4 to 8, comprising using a constraint solver to determine whether the candidate correction strategies and/or the selected candidate correction strategy violates any design and/or actuation constraint or rule, and rejecting a candidate correction strategy if it does.

10. A method according to any of clauses 4 to 9, comprising training said trained model to learn mapping between said candidate correction strategies and the quality metric and/or one or more related metrics based on historic and/or simulated process parameter data.
11. A method according to any of clauses 1 to 3, wherein said trained model is configured to: predict said quality metric from said functional indicator data; determine the statistical significance of a contribution by each of said functional indicators to predicted poor or marginal performance of said at least one quality metric; and configuring a tool associated with said semiconductor manufacturing process based on the determined statistical significance.
12. A method according to clause 11, wherein configuring a tool comprises determining a correction for a reference relating to a functional indicator determined to have made a statistically significant contribution to predicted poor performance.
13. A method according to clause 12, wherein said reference comprises a fiducial and/or wavefront sensor reference.
14. A method according to clause 12 or 13, wherein the correction for the reference is determined from or as a reference offset calculated from an error magnitude of the functional indicator determined to have made a statistically significant contribution and/or corresponding estimated quality metric.
15. A method according to any of clauses 11 to 14, wherein said trained model has been trained per process parameter and/or functional indicator,
16. A method according to any of clauses 11 to 15, comprising training said trained model on functional indicators determined from historic process parameter data labeled using corresponding process parameter data determined from historic measured or simulated quality metric data.
17. A method according to any of clauses 11 to 16, wherein said trained model is a regression type model.
18. A method according to any preceding clause, wherein said trained model is a neural network.
19. A method according to any preceding clause, wherein the quality metric comprises a categorical indicator.
20. A method according to any preceding clause, wherein the quality metric comprises or relates to overlay and/or focus used in the semiconductor manufacturing process.
21. A computer program product comprising machine readable instructions for causing a general-purpose data processing apparatus to perform the steps of a method according to any of clauses 1 to 20
22. A processing unit and storage comprising the computer program product of clause 21.
23. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and
    the processing unit of clause 22.
24. A lithographic cell comprising the lithographic apparatus of clause 23.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of physical systems such as structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of a physical structure may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of determining a correction strategy for a semiconductor manufacturing process, the method comprising:
    obtaining functional indicator data relating to one or more functional indicators associated with one or more process parameters of each of a plurality of different control regimes of the semiconductor manufacturing process and/or of a tool associated with the semiconductor manufacturing process, the one or more functional indicators representing a residual with respect to an expected, nominal or average behavior of the one or more process parameters;
    using the functional indicator data as an input to a trained model to determine for which of the control regimes should a correction be determined so as to improve performance of the semiconductor manufacturing process according to at least one quality metric being representative of a quality of the semiconductor manufacturing process; and calculating the correction for the determined control regime(s).

2. The method as claimed in claim 1, further comprising using a functional model to determine the functional indicator data based on process parameter data related to the one or more process parameters.

3. The method as claimed in claim 2, wherein the process parameter data comprises data relating to earlier exposures of more than one preceding substrate.

4. The method as claimed in claim 1, further comprising:

determining candidate correction strategies based on the one or more functional indicators, wherein each candidate correction strategy relates to a different control regime or combination thereof; and using the trained model to select a preferred correction strategy from the candidate correction strategies.

5. The method as claimed in claim 4, wherein the preferred correction strategy is one determined by the trained model to have the highest probability of improving the at least one quality metric.

6. The method as claimed in claim 4, wherein the trained model is operable to rank the candidate correction strategies in terms of their respective probabilities of improving the at least one quality metric.

7. The method as claimed in claim 6, wherein the trained model comprises an output function operable to rank the candidate correction strategies into a probability distribution.

8. The method as claimed in claim 4, further comprising:

grouping the candidate correction strategies into sets based on patterns in the functional indicator data, each set relating to a different trained model having been separately trained; and performing a pre-processing step to select a model for making the prediction.

9. The method as claimed in claim 4, further comprising:

using a constraint solver to determine whether a candidate correction strategy of the candidate correction strategies and/or the selected correction strategy violate any design and/or actuation constraint or rule; and rejecting the determine candidate and/or selected correction strategy if it does violate any design and/or actuation constraint or rule.

10. The method as claimed in claim 4, further comprising training the trained model to learn mapping between the candidate correction strategies and the at least one quality metric and/or one or more related metrics based on historic and/or simulated process parameter data.

11. The method as claimed in claim 1, wherein the trained model is configured to:

predict the at least one quality metric from the functional indicator data;

determine the statistical significance of a contribution by each of the one or more functional indicators to predicted poor or marginal performance of the at least one quality metric; and configure a tool associated with the semiconductor manufacturing process based on the determined statistical significance.

12. The method as claimed in claim 11, wherein configuring the tool comprises determining a correction for a reference relating to a functional indicator determined to have made a statistically significant contribution to predicted poor performance.

13. The method according to claim 12, wherein the reference comprises a fiducial and/or wavefront sensor reference.

14. The method as claimed in claim 11, wherein the trained model has been trained per process parameter and/or functional indicator.

15. The method as claimed in claim 11, further comprising training the trained model on one or more functional indicators determined from historic process parameter data labeled using corresponding process parameter data determined from historic measured or simulated quality metric data.

16. A non-transitory computer program product comprising machine readable instructions for causing a general-purpose data processing apparatus to at least:

obtain functional indicator data relating to one or more functional indicators associated with one or more process parameters of each of a plurality of different control regimes of a semiconductor manufacturing process and/or a tool associated with the semiconductor manufacturing process, the one or more functional indicators representing a residual with respect to an expected, nominal or average behavior;

use the functional indicator data as an input to a trained model to determine for which of the control regimes should a correction be determined so as to improve performance of the semiconductor manufacturing process according to at least one quality metric being representative of a quality of the semiconductor manufacturing process; and calculate the correction for the determined control regime (s).

17. A lithographic apparatus comprising:

a support structure configured to support a patterning device, the patterning device configured to pattern a beam of radiation according to a desired pattern;

a substrate table configured to hold a substrate;

a projection system configured the project the patterned beam onto a target portion of the substrate; and the computer program product of claim 16.

18. The method according to claim 1, wherein the at least one quality metric comprises a categorical indicator.

19. The method according to claim 1, wherein the at least one quality metric comprises or relates to overlay and/or focus used in the semiconductor manufacturing process.

20. The method according to claim 1, wherein the trained model is a regression type model or a neural network.

21. A non-transitory computer program product comprising machine readable instructions for causing a general-purpose data processing apparatus to at least:

obtain functional indicator data relating to one or more functional indicators associated with one or more process parameters of each of a plurality of different control regimes of a semiconductor manufacturing process and/or a tool associated with the semiconductor manufacturing process;

use the functional indicator data as an input to a trained model to determine for which of the control regimes should a correction be determined so as to improve performance of the semiconductor manufacturing process according to at least one quality metric being representative of a quality of the semiconductor manufacturing process, wherein the trained model is configured to:

predict the at least one quality metric from the functional indicator data;

determine the statistical significance of a contribution by each of the one or more functional indicators to predicted poor or marginal performance of the at least one quality metric; and calculate the correction for the determined control regime(s), including configuration of a tool associated with the semiconductor manufacturing process based on the determined statistical significance.

* * * * *